(12) United States Patent
Fernandez et al.

(10) Patent No.: US 9,651,617 B2
(45) Date of Patent: May 16, 2017

(54) FULL ADDRESS COVERAGE DURING MEMORY ARRAY BUILT-IN SELF TEST WITH MINIMUM TRANSITIONS

(71) Applicant: FREESCALE SEMICONDUCTOR, INC., Austin, TX (US)

(72) Inventors: Edward Bryann C. Fernandez, Austin, TX (US); David W. Chrudimsky, Austin, TX (US); Thomas Jew, Austin, TX (US)

(73) Assignee: NXP USA, Inc., Austin, TX (US)

( * ) Notice: Subject to any disclaimer, the term of this patent is extended or adjusted under 35 U.S.C. 154(b) by 136 days.

(21) Appl. No.: 14/866,094

(22) Filed: Sep. 25, 2015

(65) Prior Publication Data

US 2017/0092380 A1    Mar. 30, 2017

(51) Int. Cl.
| | |
|---|---|
| G01R 31/28 | (2006.01) |
| G01R 31/317 | (2006.01) |
| G11C 29/36 | (2006.01) |
| G11C 29/38 | (2006.01) |
| G06F 11/27 | (2006.01) |

(52) U.S. Cl.
CPC ........ *G01R 31/31724* (2013.01); *G06F 11/27* (2013.01); *G11C 29/36* (2013.01); *G11C 29/38* (2013.01)

(58) Field of Classification Search
CPC .......... G01R 31/31724; G01R 31/3187; G01R 31/318519; G06F 11/27; G11C 29/10; G11C 29/18; G11C 29/36
See application file for complete search history.

(56) References Cited

U.S. PATENT DOCUMENTS

| | | | | |
|---|---|---|---|---|
| 7,954,020 | B2 * | 5/2011 | Yoshihara | G11C 29/36 714/719 |
| 8,352,813 | B2 * | 1/2013 | He | G11C 29/36 714/718 |
| 2009/0116321 | A1 | 5/2009 | Shirur et al. | |
| 2011/0078521 | A1 | 3/2011 | He et al. | |
| 2014/0380107 | A1 * | 12/2014 | Hakhumyan | G06F 11/27 714/718 |

* cited by examiner

*Primary Examiner* — Shelly A Chase

(57) ABSTRACT

Transitioning to all addresses of a memory array during BIST includes arranging the addresses as a matrix with rows of the matrix corresponding one to one to the plurality of addresses of the memory array and columns of the matrix corresponding one to one to the plurality addresses of the memory array. A column of a selected current location can correspond to a destination address of a memory transition. The destination addresses can identify a candidate row of the matrix which corresponds to the destination address. The candidate row can be different from a row of the current location. A next location can be determined that has not been recorded in the candidate row that has a minimum column distance from the column of the first location as compared to other locations that have not been recorded in the candidate row.

20 Claims, 6 Drawing Sheets

FULL ADDRESS COVERAGE DURING MEMORY ARRAY BUILT-IN SELF TEST WITH MINIMUM TRANSITIONS

BACKGROUND

Field

This disclosure relates generally to integrated circuits, and more particularly, to covering all addresses in a memory array while minimizing transition time between addresses during built-in self test.

Related Art

Memory devices include an array of memory cells that are addressed on a row by column basis. Many memory devices include built-in self test (BIST) logic that is used to determine whether the memory cells in the array are functioning properly. Due to the large number of cells in the array, the time required to address and test each cell individually is prohibitively long, so a subset of the cells is typically tested instead. If all of the cells in the chosen subset pass BIST, it is assumed that the remaining cells will also pass BIST. Under some circumstances, it is desirable to test all of the cells in the array, while minimizing the time required to test the memory cells.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of memory devices and methods disclosed herein generate a locally optimal choice at each stage (also referred to as a greedy routing strategy) to transition from one address to another during built-in self test (BIST). The greedy routing strategy uses the minimum number of address transitions while exercising all switching between decoder lines to expose all possible transition faults in minimum execution time. Each output of a decoder is accessed for every address transition including selected to unselected addresses, and unselected to selected addresses. Decoder line transitions are represented as matrix elements. All the matrix elements are covered to ensure all decoder line transitions are tested.

Figure 1:
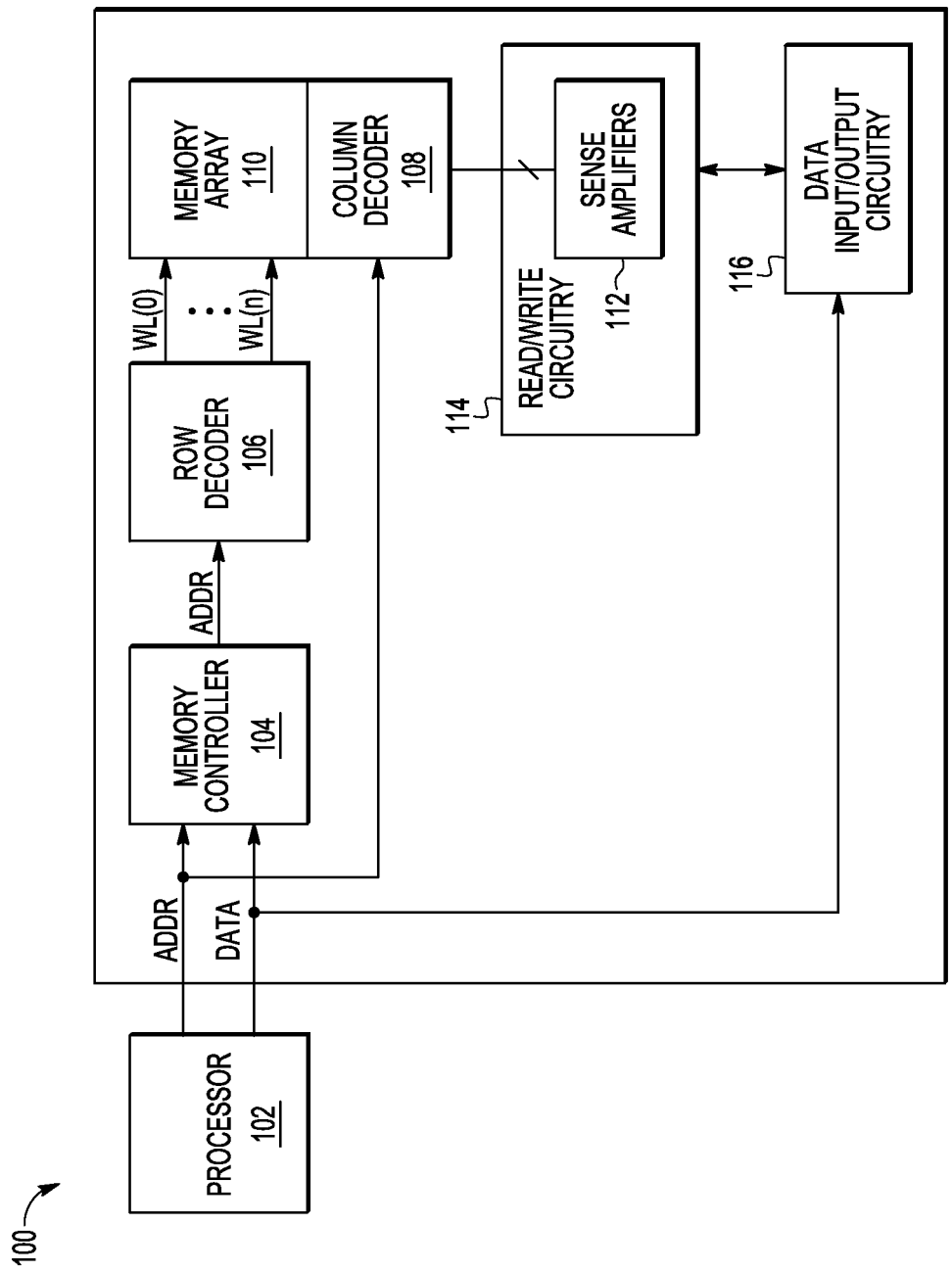
FIG. 1 illustrates a block diagram of an embodiment of a memory device.

Shown in FIG. 1 is a block diagram of an embodiment of a processing system including processor 102 coupled to memory device 100 that includes memory cell array 110, memory controller 104, a row decoder 106 coupled to array 110 and memory controller 104, and a column decoder 108 coupled to array 110 and memory controller 104. Memory controller 104 provides addresses and control signals to access array 110 by directing the operations of row decoder 106, column decoder 108, and memory read/write circuitry 114 including sense amplifiers 112. Memory cells in array 110 are selected for reading or writing with output from row decoder 106 and column decoder 108. Read/write circuitry performs the read and write operations. Input/output circuitry 116 provides data signals to read/write circuitry 114 and receives data signals from read/write circuitry 114. Read/write circuitry 114 includes one or more sense amplifiers 24 coupled to column decoder 108 to sense the voltage on bit lines coupled to the memory cells in array 110 during read operations. Row decoder 106 provides signals on word lines WL(0:n), where each word line is coupled to a row of memory cells in array 110. Column decoder 108 provides signals on pairs of true and complementary bit lines (not shown) coupled to respective columns of memory cells in array 110. Read and write operations are performed on memory cells in array 110 by controlling signals on corresponding word lines and bit lines.

Figure 2:
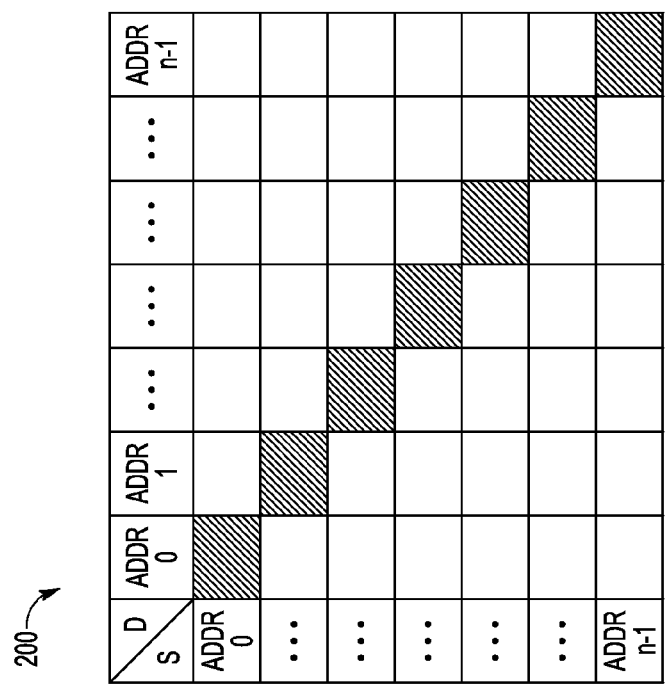
FIG. 2 illustrates an embodiment of an address array that is used during built-in self test when all memory address transitions are exercised.

Referring to FIGS. 1 and 2, FIG. 2 illustrates an embodiment of a two-dimensional matrix 200 of decoder lines that can be used during BIST to exercise all memory address transitions in array 110. A first column of matrix 200 includes indices of source decoder lines and a first row of matrix 200 includes indices of destination decoder lines. The indices correspond decoder lines of the row decoder 106 or column decoder 108, for example. For the row decoder 106, the decoder lines are the word lines (WL(0:n)), and for the column decoder 108, the decoder lines are true and complementary bit lines. The addresses or indices of the decoder lines in the source column are the same indices or addresses that are in the destination row. Selecting each row/column combination in the 2nd to nth rows and columns will allow all circuitry in the memory array 110 to be tested. Note that the elements on the diagonal in matrix 200 are not used because the source address and destination address are the same and therefore there is no transition to be tested.

Figure 3:
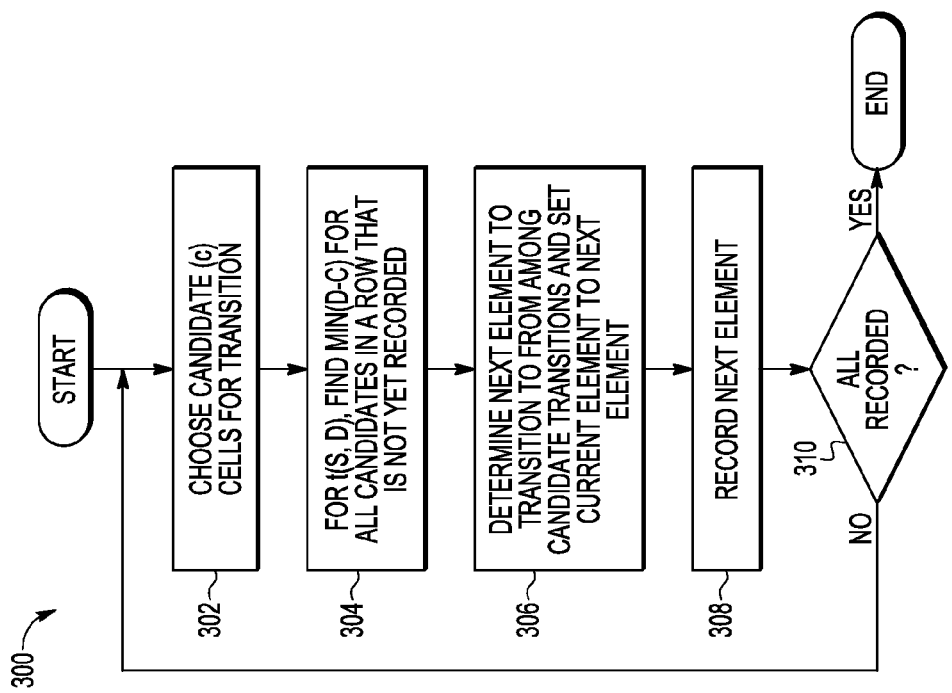
FIG. 3 illustrates a flowchart of an embodiment of a method for transitioning between addresses during built-in self-test of the array.

Referring to FIGS. 1, 2 and 3, FIG. 3 illustrates a flowchart of an embodiment of a method 300 for transitioning between decoder lines during built-in self-test of memory device 100. Process 302 includes choosing candidate cells for transitioning from one decoder line to another. The candidate cells can be selected based on a current location in matrix 200. The coordinates of the current location correspond to a row and column in matrix 200. The candidate transitions can be those coordinates (row, column) that have a have a minimum distance from the current location and have not already been tested and recorded. Further details on a particular method for selecting candidate transitions are described in connection with FIGS. 5 and 6.

Process 304 includes determining all candidate transitions from a source decoder line to a destination decoder line (S, D) that have not been recorded. A difference and direction from a current element to the selected candidate element of matrix 200 is recorded once a transition (t) to or from the element has been tested. Since matrix 200 tests each decoder line as both the source and the destination with all other elements of matrix 200, all memory cells associated with memory array 110 are tested during BIST. By selecting from among the candidate elements (C) with the shortest distance (t(S, D)=min(D−C)) from the current element, process 304 insures that the number of addresses required to test all possible combinations of source and destination is minimized.

Process 306 includes determining the next element or coordinates of matrix 200 to transition from among the candidate transitions found in process 304. The next element will be one of the elements (if there is more than one candidate transition) that has the minimum absolute "distance" from the current element. The destination coordinate (S) of the current element can become the source coordinate (D) of the next element. For example, if no transitions have been tested and recorded, and the current element is source 0, destination 1, the candidate transitions are (1, 0), and (1, 2) in matrix 200, where the destination, "1", becomes the sources of candidate transitions (1, 0) and (1,2).

When there are two or more candidate transitions, a rule such as "select the candidate transition to the right of the current element", a random selection, or other suitable criteria can be used. In the example given in the preceding paragraph, the candidate transition (row 1, column 2) would be selected if the candidate transition to the right of the current element (row 0, column 1) is chosen. When the next column would exceed the number of decoder lines, the direction can change to transition from right to left, as further described in connection with FIGS. 5 and 6.

Once the next element is selected, the current element is then set to the next element. Process 308 includes recording a difference or distance from the diagonal of matrix 200 as well as the direction of the difference from the diagonal of matrix 200 to keep track of the element last tested for each decoder line. Keeping a record of transitions that have been tested avoids duplicating transitions and helps minimize time required for BIST. Process 310 determines whether all possible source and destination transitions have been recorded for matrix 200. If all possible transitions have been recorded for matrix 200, method 300 ends. If all possible transitions have not been tested, process 310 returns to process 302 to begin the process of determining and selecting candidate transitions from the current element.

Figure 4:
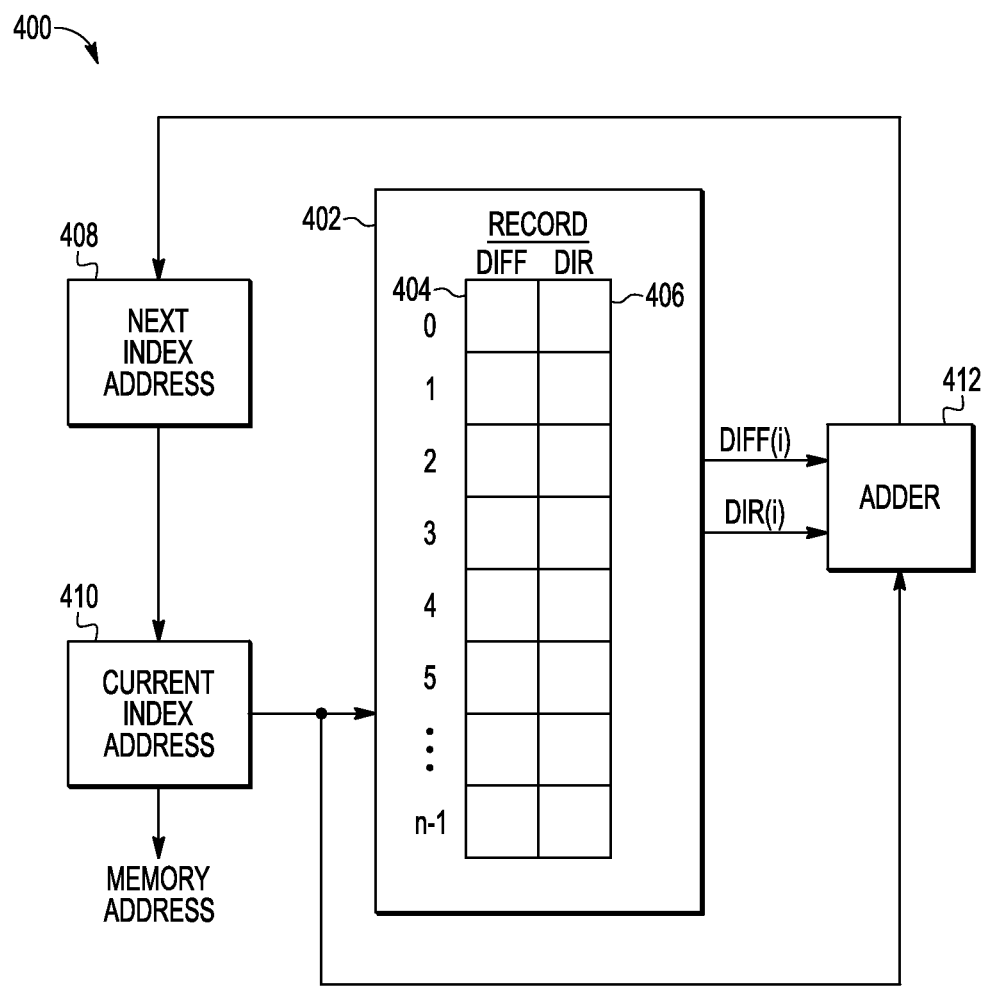
FIG. 4 illustrates an embodiment of record circuitry in a memory controller that can be used to keep track of addresses that have been tested in the memory device of FIG. 1 and in the method 300 of FIG. 3.

FIG. 4 illustrates an embodiment of record circuitry 400 in memory controller 104 (FIG. 1) that can be used to keep track of transitions between decoder lines to insure all lines are tested. Record circuitry 400 includes a set of registers 402. Each entry in registers 402 includes a difference (DIFF) value 404 between the diagonal element in the row of the current element and the column of the current element, and a direction value (DIR) 406 from the diagonal element in the row of the current element.

Record circuitry 400 also includes next index address unit 408, current index address unit 410, and adder unit 412. Current index address unit 410 stores and provides the current index address for the record which identifies a current entry or register 402 from which candidate transactions are evaluated. In some implementations, each register 402 corresponds to a particular decoder line and the current index address corresponds to one of the decoder lines. For example, if there are 32 decoder lines numbered from 0 to 31, the current index address for the 5th decoder line will be 4. The current index address is initialized and updated thru the next index address. The difference 404 and direction 406 for the current index address in registers 402 can also be accessed by current index address 410.

Each element in matrix 200 (FIG. 2) has a row and column coordinate, which are referred to as source and destination, respectively. After a transition, the current destination coordinate becomes the next source coordinate, and candidate elements in matrix 200 are chosen from the next source coordinate. Each candidate destination coordinate has a distance or difference 404 from a diagonal element in a row, and a direction from the diagonal element. The distance of the candidate element that has not already been recorded and has a minimum difference from the column of the current element is selected as the next element. The record updates the difference 404 and direction 406 based on the current index address in a corresponding register 402. The adder unit 412 computes the next source coordinate by using the difference, direction and current index address. A direction of RIGHT adds the difference to the current index address and a direction of LEFT subtracts the difference to the current index address. The next source coordinate is stored in next index address unit 408.

Figure 5:
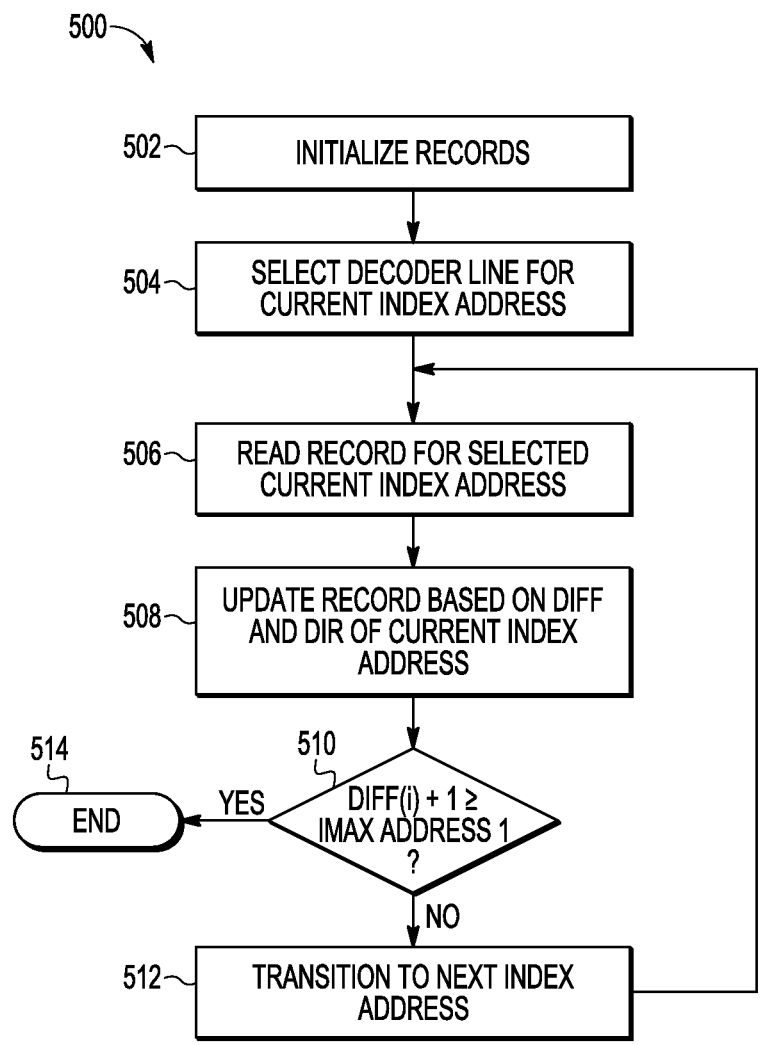
FIG. 5 illustrates a flowchart of an embodiment of a method for using record circuitry of FIG. 4 while testing the memory device of FIG. 1.

Referring to FIGS. 4 and 5, FIG. 5 illustrates a flowchart of an embodiment of a method 500 for using record circuitry 400 while testing memory device 100. Process 502 includes initializing records or registers 402 at the beginning the test. For example, the distance or difference 404 for each entry can be initialized to 0 and the direction 406 for each entry can be initialized to a value of LEFT.

Process 504 includes selecting a decoder line for the current index address. As an example, the address or index of the first decoder line in the source column of matrix 200 can be chosen. The indices or addresses can start at zero or one and extend to the total number of decoder lines n (or n minus 1 if starting at zero). The current index address can be stored in current index address unit 410.

Figure 6:
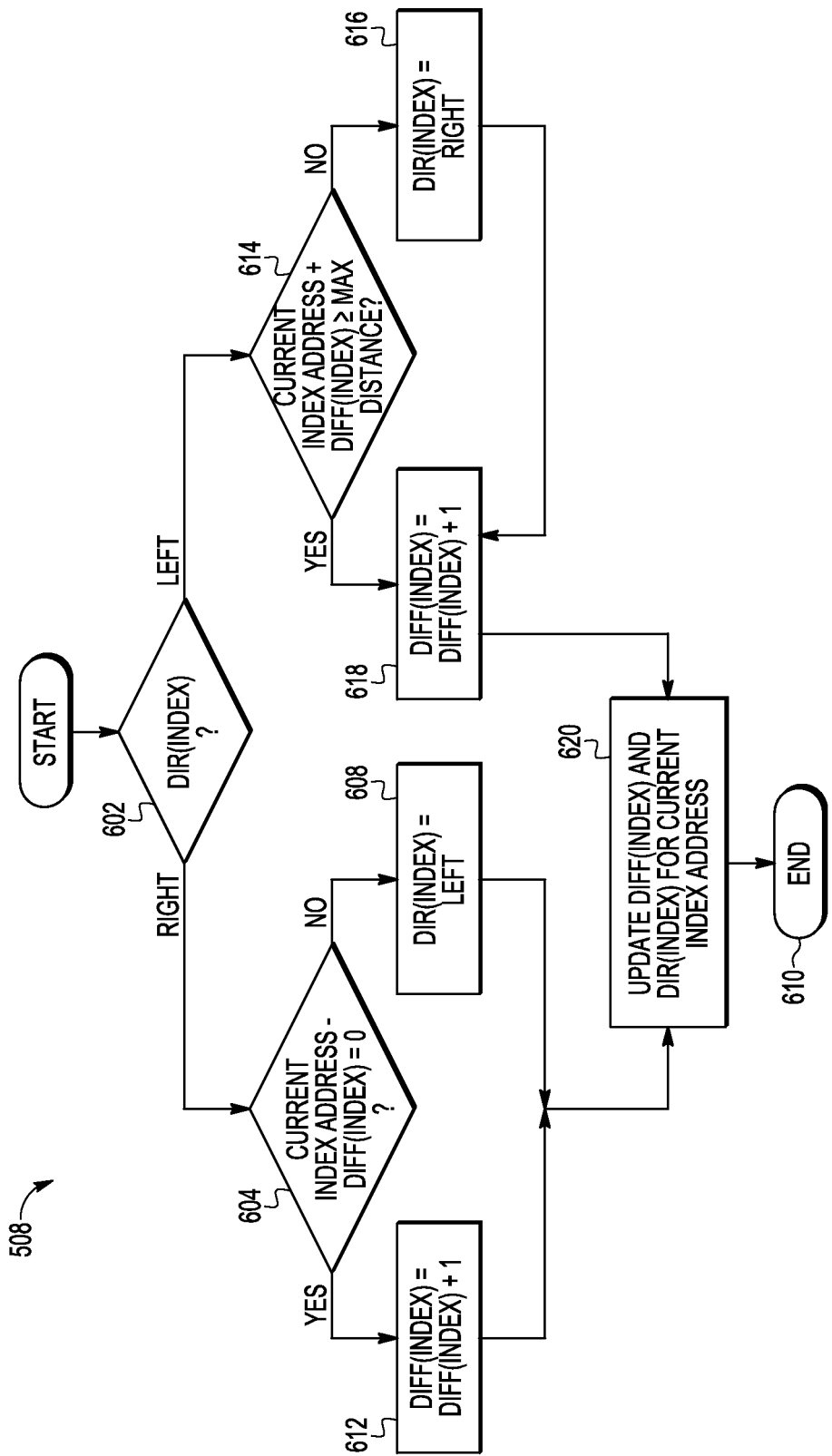
FIG. 6 illustrates a flowchart of an embodiment of a method for updating records that can be used in the method of FIG. 5.

Process 506 includes reading the register 402 or record for difference 404 and direction 406 of the current index address for use by adder unit 412. Process 508 includes updating the register 402 of the current index address based on the difference 404 and direction 406 of the current index address. FIG. 6 illustrates a flowchart of an embodiment of method 508 for updating records that can be used for process 508 in method 500 of FIG. 5.

Referring to FIGS. 5 and 6, after process 602 begins method 508 in FIG. 6, process 604 determines whether the direction 406 of the entry associated with the current entry address is a first value or a second value. In the example shown, the direction values can be RIGHT or LEFT. If the direction 406 is RIGHT, process 604 includes determining whether the current index address minus the difference 404 associated with the current index address is equal to zero. If the current index address minus the difference 404 associated with the current index address is not equal to zero, process 608 changes the direction 406 associated with the current index address to the other value, or LEFT in this example. Process 608 then transitions to process 620 to record the difference 404 and direction 406 in the register 402 associated with the current index address. If the current index address minus the difference 404 associated with the current index address is equal to zero, process 612 increments the difference 404 associated with the current index address by one. Process 612 then transitions to process 620 to record the difference 404 and direction 406 in the register 402 associated with the current index address.

Referring back to process 602, if the direction 406 associated with the current index address is LEFT, process 614 includes determining whether the current index address plus the difference 404 associated with the current index address is greater than or equal to a maximum distance or index address. If the current index address plus the difference 404 associated with the current index address is not greater than or equal to the maximum address or distance, process 616 changes the direction 406 associated with the current index address to the other value, or RIGHT in this example. Process 618 increments the difference 404 associated with the current index address by one. Process 618 then transitions to process 620 to record the difference 404 and direction 406 in the register 402 associated with the current index address. If the current index address plus the difference 404 associated with the current index address is greater than or equal to the maximum address or distance, process 614 transitions directly to process 620 to record the difference 404 and direction 406 in the register 402 associated with the current index address.

Referring again to FIG. 5, once the register 402 for the current index address is updated, process 510 includes determining whether the difference 404 for the current index address and incremented by one is greater than the maximum address. If the incremented difference 404 for the current index address is not greater than the maximum index address, process 512 transitions or sets the current index address to the next index address 408 for the decoder line. Process 512 then transitions to process 506 to continue updating registers 402 as minimized transitions are determined and memory device 100 is tested. Once the incremented difference 404 for the current index address is greater than the maximum number of decoder lines, process 510 transitions to process 514 to end method 500.

Figure 7:
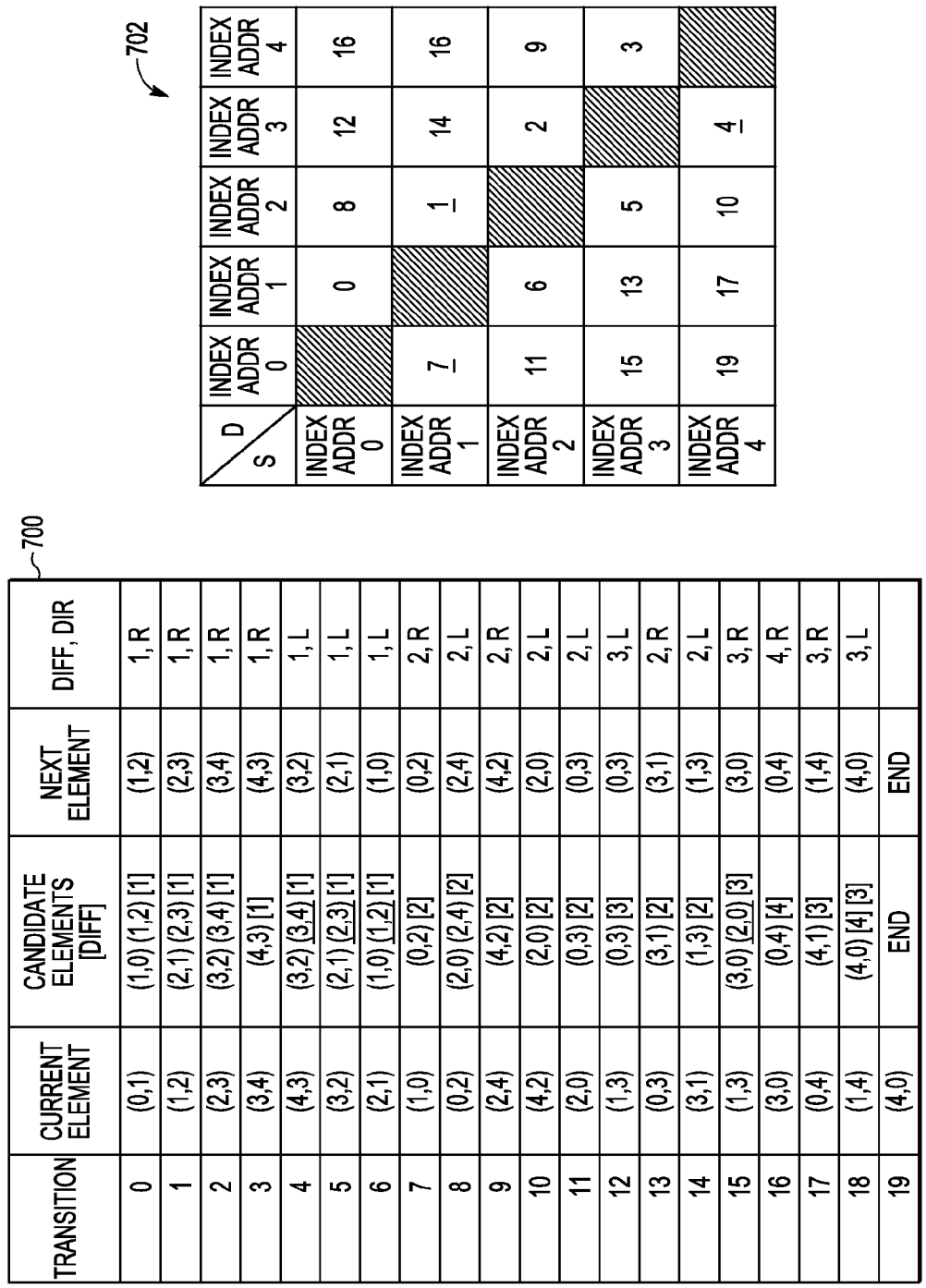
FIG. 7 illustrates an example of source, candidate and destination addresses and an address array that can be used in the memory device of FIG. 1 and in the method of FIG. 3.

FIG. 7 illustrates an example of a table 700 with current element, candidate elements, and next elements, and an address array 702 showing the sequence of selecting candidate transitions using the methods 500, 508 of FIGS. 5 and 6. Matrix elements on the diagonal in matrix 702 are shaded to indicate they are not valid transitions and therefore do not need to be tested since the source and destination are the same.

During initialization, all the difference 404 and direction 406 values in all registers 402 are set to initial values, such as (0, LEFT). In the first row of table 700, the current matrix element corresponding to current index address of 0 is (0, 1). Candidate elements for the first transition include the matrix element at (1, 0) and (1, 2). Following a rule of starting transitions to the right of the current element, matrix element (1, 2) is selected as the next element for transition (1). The difference 404 and direction 406 values for current index address 0 are (1, R) (for RIGHT)) because element (1, 2) is one index space to the right of diagonal element (1, 1). Candidate elements continue to be chosen to the right of the current index address until the maximum index is reached. The next index address is 2 because the current destination (or column) coordinate becomes the next source (or row) coordinate, which is used as the next index address, and to find candidate elements for transitions.

For the next transition (2), the next index address of 1 becomes the current index address. From element (1, 2), the candidate elements are (2, 1) and (2, 3). Matrix element (2, 3) to the right of element (1, 2) is chosen as the next element with a next index address of 3. The difference 404 and direction 406 values for current index address 1 are recorded as (1, R) because element (2, 3) is one index space to the right of diagonal element (2, 2).

For the next transition (3), the next index address of 3 becomes the current index address. From element (2, 3), the candidate elements are (3, 2) and (3, 4). Matrix element (3, 4) to the right of element (2, 3) is chosen as the next element with a next index address of 4. The difference 404 and direction 406 values for current index address 2 are recorded as (1, R) because element (3, 4) is one index space to the right of diagonal element (3, 3).

For the next transition (4), the next index address of 4 becomes the current index address. From element (3, 4), candidate element is (4, 3) to the left of element (3, 4) is chosen as the next element with a next index address of 3. The difference 404 and direction 406 values for current index address 4 are recorded as (1, L) because element (4, 3) is one index space to the left of diagonal element (4, 4).

For the next transition (5), the next index address of 3 becomes the current index address. From element (4, 3), candidate elements are (3, 2) and (3, 4). Element (3, 2) is chosen since element (3, 4) has already been recorded, as indicated by the underline. The next index address is 2. The difference 404 and direction 406 values for current index address 3 are recorded as (1, L) because element (3, 2) is one index space to the left of diagonal element (3, 3).

For the next transition (6), the next index address of 2 becomes the current index address. From element (3, 2), candidate elements are (2, 1) and (2, 3). Element (2, 1) is chosen since element (2, 3) has already been recorded, as indicated by the underline. The next index address is 1. The difference 404 and direction 406 values for current index address 2 are recorded as (1, L) because element (2, 1) is one index space to the left of diagonal element (2, 2).

For the next transition (7), the next index address of 1 becomes the current index address. From element (2, 1), candidate elements are (1, 0) and (1, 2). Element (1, 0) is chosen since element (1, 2) has already been recorded, as indicated by the underline. The next index address is 0. The difference 404 and direction 406 values for current index address 1 are recorded as (1, L) because element (1, 0) is one index space to the left of diagonal element (1, 1).

For the next transition (8), the next index address of 0 becomes the current index address. From element (1, 0), the only candidate element is (0, 2) since there are no more spaces to the left of diagonal element (0, 0). The next index address is 2. The difference 404 and direction 406 values for current index address 0 are recorded as (2, R) because element (0, 2) is two index spaces to the right of diagonal element (0, 0).

For the next transition (9), the next index address of 2 becomes the current index address. From element (0, 2), the candidate elements are (2, 0) and (2, 4). Element (2, 4) is chosen as being the candidate element to the right. The next index address is 4. The difference 404 and direction 406 values for current index address 0 are recorded as (2, R) because element (0, 2) is two index spaces to the right of diagonal element (3, 3).

For the next transition (10), the next index address of 4 becomes the current index address. From element (2, 4), the only candidate element is (4, 2) since column 4 is the last column of matrix 702. The next index address becomes 2. The difference 404 and direction 406 values for current index address 4 are recorded as (2, L) because element (4, 2) is two index spaces to the left of diagonal element (4, 4).

For the next transition (11), the next index address of 2 becomes the current index address. From element (4, 2), the only candidate element is (2, 0). The next index address becomes 0. The difference 404 and direction 406 values for current index address 2 are recorded as (2, R) because element (2, 0) is two index spaces to the left of diagonal element (2, 2).

For the next transition (12), the next index address of 0 becomes the current index address. From element (2, 0), the only candidate element is (0, 3). The next index address becomes 3. The difference 404 and direction 406 values for current index address 0 are recorded as (3, R) because element (0, 3) is three index spaces to the right of diagonal element (0, 0).

For the next transition (13), the next index address of 3 becomes the current index address. From element (0, 3), the only candidate element is (3, 1). The next index address becomes 1. The difference 404 and direction 406 values for current index address 1 are recorded as (2, L) because element (3, 1) is two index spaces to the left of diagonal element (3, 3).

For the next transition (14), the next index address of 1 becomes the current index address. From element (3, 1), the only candidate element is (1, 3). The next index address becomes 3. The difference 404 and direction 406 values for current index address 1 are recorded as (2, R) because element (1, 3) is two index spaces to the right of diagonal element (1, 1).

For the next transition (15), the next index address of 3 becomes the current index address. From element (1, 3), the only candidate element is (3, 0). The next index address becomes 0. The difference 404 and direction 406 values for current index address 3 are recorded as (3, L) because element (3, 0) is three index spaces to the left of diagonal element (3, 3).

For the next transition (16), the next index address of 0 becomes the current index address. From element (3, 0), the only candidate element is (0, 4). The next index address becomes 4. The difference 404 and direction 406 values for current index address 0 are recorded as (4, R) because element (0, 4) is four index spaces to the right of diagonal element (0, 0).

For the next transition (17), the next index address of 4 becomes the current index address. From element (0, 4), the only candidate element is (4, 1). The next index address becomes 1. The difference 404 and direction 406 values for current index address 4 are recorded as (3, L) because element (4, 1) is three index spaces to the left of diagonal element (4, 4).

For the next transition (18), the next index address of 1 becomes the current index address. From element (4, 1), the only candidate element is (1, 4). The next index address becomes 4. The difference 404 and direction 406 values for current index address 1 are recorded as (3, R) because element (1, 4) is three index spaces to the right of diagonal element (4, 4).

For the next transition (19), the next index address of 4 becomes the current index address. From element (1, 4), the only candidate element is (4, 0). The next index address becomes 0. The difference 404 and direction 406 values for current index address 4 are recorded as (4, L) because element (4, 0) is four index spaces to the left of diagonal element (4, 4).

Once the value of the difference 404 incremented by 1 is greater than the absolute value of the maximum index address, process 510 (FIG. 5) ends method 500. In the present example, the maximum address is 4, so once an entry in registers 402 has a difference value of 4 and direction is LEFT, the difference of 4 incremented by 1 is greater than the maximum address of 4 and direction is LEFT, and method 500 ends.

By now it should be appreciated that in some embodiments there has been disclosed a method that can comprise arranging a plurality of addresses of a memory array as a matrix with rows of the matrix corresponding one to one to the plurality of addresses of the memory array and columns of the matrix corresponding one to one to the plurality of addresses of the memory array. A current location in the matrix can be selected. A column of the current location can correspond to a destination address of a memory transition. The destination addresses can identify a candidate row of the matrix which corresponds to the destination address. The candidate row can be different from a row of the current location. A next location can be determined that has not been recorded in the candidate row that has a minimum column distance from the column of the first location as compared to other locations that have not been recorded in the candidate row. The next location can be recorded and a read access to an address of the memory array corresponding to a row of the next location can be performed.

In another aspect, the rows and the columns of the matrix can correspond to a same order of the plurality of addresses of the memory array.

In another aspect, the read access can be performed to test a transition from an address corresponding to a row of the current location to an address corresponding to a row of the next location.

In another aspect, the method can further comprise repeating the selecting the current location in the matrix, the determining the next location, and the recording the next location. The selecting the current location can be performed such that the next location is selected as the current location.

In another aspect, the repeating can continue until all locations of the matrix whose column and row corresponds to different addresses of the plurality of addresses than have been recorded.

In another aspect, the repeating can comprise repeating the performing the read access.

In other embodiments, a memory can comprise a memory array having a plurality of row addresses and a memory controller. The memory controller can comprise a record having a plurality of entries corresponding to the plurality of row addresses. Each entry can be configured to store a distance and a direction. The distance can indicate a minimum distance to another row of the plurality of rows whose transition from the row address to the other row has not been recorded as a test transition and the direction can indicate the direction of the another row as above or below the row address. A current index address unit which provides a current index address for the record which identifies a current entry of the record. The current entry of the record can correspond to a current row address of the memory array. The memory controller can be configured to perform a read from the current row address. A next index address unit can use the current index address and the distance and direction of the current entry to determine a next index address for the record.

In another aspect, the next index address unit can be configured to add the distance to the current index address to determine the next index address when the direction has a first value (Right) and subtract the distance from the current index address to determine the next index address when the direction has a second value (Left).

In another aspect, the memory controller can be configured to update the current entry of the record after the next index address is determined.

In another aspect, updating the current entry can comprise, if the direction of the current entry has the first value, determining if the current index address minus the distance of the current entry is zero, and if so, add a predetermined address offset to the distance of the current entry, and if not, update the direction to the second value.

In another aspect, updating the current entry can comprise if the direction of the current entry has the second value:

determining if the current index address plus the distance is less than a maximum distance between two row address of the memory array, and if so, update the direction to the first value, and update the distance of the current entry by adding a predetermined address offset.

In another aspect, the memory controller can be configured to set the next index address as the current index address and repeat determining the next index address until test transitions between each row of the plurality of row addresses and each other row of the plurality of row addresses have been recorded.

In another aspect, the memory controller can be configured to perform a read from each current row address.

In still further embodiments, in a memory having a memory array and a record which includes a plurality of entries corresponding to a plurality of row address of the memory array wherein each entry is configured to store a distance and a direction, a method can comprise providing a current index address for the record which identifies a current entry of the record, wherein the current entry of the record corresponds to a current row address of the memory array. The distance in each entry of the record can indicate a minimum distance to another row of the plurality of rows whose transition from the row address to the another row has not been recorded as a test transition and the direction indicates the direction of the another row as above or below the row address. The current index address and the distance and direction of the current entry can be used to determine a next index address for the record. A read in the memory from the current row address can be performed, the current entry can be updated.

In another aspect, the current index address and the distance and direction of the current entry can be used to determine the next index address by adding the distance to the current index address to determine the next index address when the direction has a first value (Right); and subtracting the distance from the current index address to determine the next index address when the direction has a second value (Left).

In another aspect, updating the current entry can comprise, if the direction of the current entry has the first value: determining if the current index address minus the distance of the current entry is zero, and if so, add a predetermined address offset to the distance of the current entry, and if not, update the direction to the second value.

In another aspect, updating the current entry can comprise, if the direction of the current entry has the second value, determining if the current index address plus the distance is less than a maximum distance between two row address of the memory array, and if so, updating the direction to the first value, and updating the distance of the current entry by adding a predetermined address offset.

In another aspect, the method can further comprise setting the next index address as the current index address; and repeating the determining the next index address until test transitions between each row of the plurality of row addresses and each other row of the plurality of row addresses have been recorded.

In another aspect, the method can further comprise performing a read in the memory from each current row address.

In another aspect, the method can further comprise, after the updating the current entry, if the distance of the current entry added with a predetermined address offset is greater than a maximum address, stopping the repeating.

Although the invention is described herein with reference to specific embodiments, various modifications and changes can be made without departing from the scope of the present invention as set forth in the claims below. For example, the particular type of non-volatile resistive element can vary from that disclosed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. In a memory, a method comprising:
arranging a plurality of addresses of a memory array as a matrix with rows of the matrix corresponding one to one to the plurality of addresses of the memory array and columns of the matrix corresponding one to one to the plurality addresses of the memory array;
selecting a current location in the matrix, wherein a column of the current location corresponds to a destination address of a memory transition, wherein the destination addresses identifies a candidate row of the matrix which corresponds to the destination address, wherein the candidate row is different from a row of the current location;
determining a next location that has not been recorded in the candidate row that has a minimum column distance from the column of the first location as compared to other locations that have not been recorded in the candidate row;
recording the next location; and
performing a read access to an address of the memory array corresponding to a row of the next location.

2. The method of claim 1, wherein the rows and the columns of the matrix correspond to a same order of the plurality of addresses of the memory array.

3. The method of claim 1, wherein the read access is performed to test a transition from an address corresponding to a row of the current location to an address corresponding to a row of the next location.

4. The method of claim 1, further comprising:
repeating the selecting the current location in the matrix, the determining the next location, and the recording the next location, wherein the selecting the current location is performed such that the next location is selected as the current location.

5. The method of claim 4, wherein the repeating continues until all locations of the matrix whose column and row corresponds to different addresses of the plurality of addresses than have been recorded.

6. The method of claim 4, further comprising:
the repeating comprises repeating the performing the read access.

7. A memory comprising:
a memory array having a plurality of row addresses; and
a memory controller, wherein the memory controller comprises:
   a record having a plurality of entries corresponding to the plurality of row addresses, wherein each entry is configured to store a distance and a direction, wherein the distance indicates a minimum distance to another row of the plurality of rows whose transition from the row address to the another row has not been recorded as a test transition and the direction indicates the direction of the another row as above or below the row address;
   a current index address unit which provides a current index address for the record which identifies a current entry of the record, wherein the current entry of the record corresponds to a current row address of the memory array, wherein the memory controller is configured to perform a read from the current row address; and
   a next index address unit which uses the current index address and the distance and direction of the current entry to determine a next index address for the record.

8. The memory of claim 7, wherein the next index address unit is configured to add the distance to the current index address to determine the next index address when the direction has a first value (Right) and subtract the distance from the current index address to determine the next index address when the direction has a second value (Left).

9. The memory of claim 8, wherein the memory controller is configured to update the current entry of the record after the next index address is determined.

10. The memory of claim 9, wherein updating the current entry comprises:
if the direction of the current entry has the first value:
   determining if the current index address minus the distance of the current entry is zero, and if so, add a predetermined address offset to the distance of the current entry, and if not, update the direction to the second value.

11. The memory of claim 9, wherein updating the current entry comprises:
if the direction of the current entry has the second value:
   determining if the current index address plus the distance is less than a maximum distance between two row address of the memory array, and if so, updating the direction to the first value, and updating the distance of the current entry by adding a predetermined address offset.

12. The memory of claim 7, wherein the memory controller is configured to set the next index address as the current index address and repeats determining the next index address until test transitions between each row of the plurality of row addresses and each other row of the plurality of row addresses have been recorded.

13. The memory of claim 12, wherein the memory controller is configured to perform a read from each current row address.

14. In a memory having a memory array and a record which includes a plurality of entries corresponding to a plurality of row address of the memory array wherein each entry is configured to store a distance and a direction, a method comprising:
providing a current index address for the record which identifies a current entry of the record, wherein the current entry of the record corresponds to a current row address of the memory array, wherein:
   the distance in each entry of the record indicates a minimum distance to another row of the plurality of rows whose transition from the row address to the another row has not been recorded as a test transition and
   the direction indicates the direction of the another row as above or below the row address;
using the current index address and the distance and direction of the current entry to determine a next index address for the record;
performing a read in the memory from the current row address; and
updating the current entry.

15. The method of claim 14, wherein the using the current index address and the distance and direction of the current entry to determine the next index address comprising:
adding the distance to the current index address to determine the next index address when the direction has a first value (Right); and
subtracting the distance from the current index address to determine the next index address when the direction has a second value (Left).

16. The method of claim 15, wherein the updating the current entry comprises:
if the direction of the current entry has the first value:
   determining if the current index address minus the distance of the current entry is zero, and if so, add a predetermined address offset to the distance of the current entry, and if not, update the direction to the second value.

17. The method of claim 15, wherein the updating the current entry comprises:
if the direction of the current entry has the second value:
   determining if the current index address plus the distance is less than a maximum distance between two row address of the memory array, and if so, updating the direction to the first value, and updating the distance of the current entry by adding a predetermined address offset.

18. The method of claim 14, further comprising:
setting the next index address as the current index address; and
repeating the determining the next index address until test transitions between each row of the plurality of row addresses and each other row of the plurality of row addresses have been recorded.

19. The method of claim 18, further comprising:
performing a read in the memory from each current row address.

20. The method of claim 18, further comprising:
after the updating the current entry, if the distance of the current entry added with a predetermined address offset is greater than a maximum address, stopping the repeating.

* * * * *